(12) United States Patent
Shinohara

(10) Patent No.: US 6,979,909 B2
(45) Date of Patent: Dec. 27, 2005

(54) SEMICONDUCTOR DEVICE AND METHOD OF MANUFACTURING SAME

(75) Inventor: Toshiaki Shinohara, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 452 days.

(21) Appl. No.: 09/895,319

(22) Filed: Jul. 2, 2001

(65) Prior Publication Data

US 2002/0109211 A1    Aug. 15, 2002

(30) Foreign Application Priority Data

Feb. 9, 2001    (JP)    ............................. 2001-033707

(51) Int. Cl.[7] ............................................. H01L 23/28
(52) U.S. Cl. ...................... 257/796; 257/706; 257/712
(58) Field of Search ................................ 257/666, 674, 257/675, 676, 690, 701, 706, 712–718, 723, 257/796, 671, 670, 692, 725, 672, 669, 696

(56) References Cited

U.S. PATENT DOCUMENTS

| | | | |
|---|---|---|---|
| 5,057,906 A | | 10/1991 | Ishigami |
| 5,293,301 A | * | 3/1994 | Tanaka et al. ............... 361/707 |
| 5,317,194 A | | 5/1994 | Sako |
| 5,440,169 A | | 8/1995 | Tomita et al. |
| 5,598,034 A | | 1/1997 | Wakefield et al. |
| 5,703,399 A | * | 12/1997 | Majumdar et al. .......... 257/723 |
| 5,767,573 A | * | 6/1998 | Noda et al. |
| 5,959,349 A | * | 9/1999 | Wensel ........................ 257/712 |
| 5,986,336 A | | 11/1999 | Tomita |
| 6,297,959 B1 | * | 10/2001 | Ueno et al. |

FOREIGN PATENT DOCUMENTS

| | | |
|---|---|---|
| DE | 44 00 341 | 7/1994 |
| DE | 196 25 240 | 4/1997 |
| DE | 197 00 056 | 9/1997 |
| EP | 0 777 272 | 6/1997 |
| JP | 10-93015 | 4/1988 |
| JP | 8-78461 | 3/1996 |

(Continued)

OTHER PUBLICATIONS

G. Majumdar, et al."Novel Intelligent Power Modules for Low-Power Inverters", 1998 IEEE Power Electronics Specialists Conference, vol. 2, pp. 1173-1179.

(Continued)

*Primary Examiner*—Hoai Pham
*Assistant Examiner*—DiLinh Nguyen
(74) *Attorney, Agent, or Firm*—Oblon, Spivak, McClelland, Maier & Neustadt, P.C.

(57) ABSTRACT

A lead frame (2a) has a die bonding pad portion (3) and an inner lead portion (4). A power element (1) is mounted on the die bonding pad portion (3) of the lead frame (2a) and is bonded to the die bonding pad portion (3) with solder (9). The power element (1) has electrodes connected through an aluminum wire (8) to the inner lead portion (4) of another lead frame (2b). A metal block (5) has a surface formed with a protrusion bonded to the lead frame (2a) in opposed relation to the power element (1). A resin package (6) has an insulation layer (7) formed on the opposite surface of the metal block (5) from the lead frame (2a), and seals the power element (1), the lead frames (2a, 2b) and the metal block (5). An external heat dissipator (11) is mounted on a surface of the insulation layer (7) opposite from the metal block (5). A semiconductor device and a method of manufacturing the same improve a heat dissipation characteristic and maintain a dielectric breakdown voltage.

7 Claims, 8 Drawing Sheets

FOREIGN PATENT DOCUMENTS

| | | |
|---|---|---|
| JP | 9-186269 | 7/1997 |
| JP | 10-135380 | 5/1998 |
| JP | 11-17071 | 1/1999 |
| JP | 11-243166 | 7/1999 |
| KR | 0065249 | 4/1993 |

OTHER PUBLICATIONS

U.S. Appl. No. 09/895,025, filed Jul. 2, 2001, Pending.

U.S. Appl. No. 09/895,319, filed Jul. 2, 2001, Pending.

* cited by examiner

F I G. 3
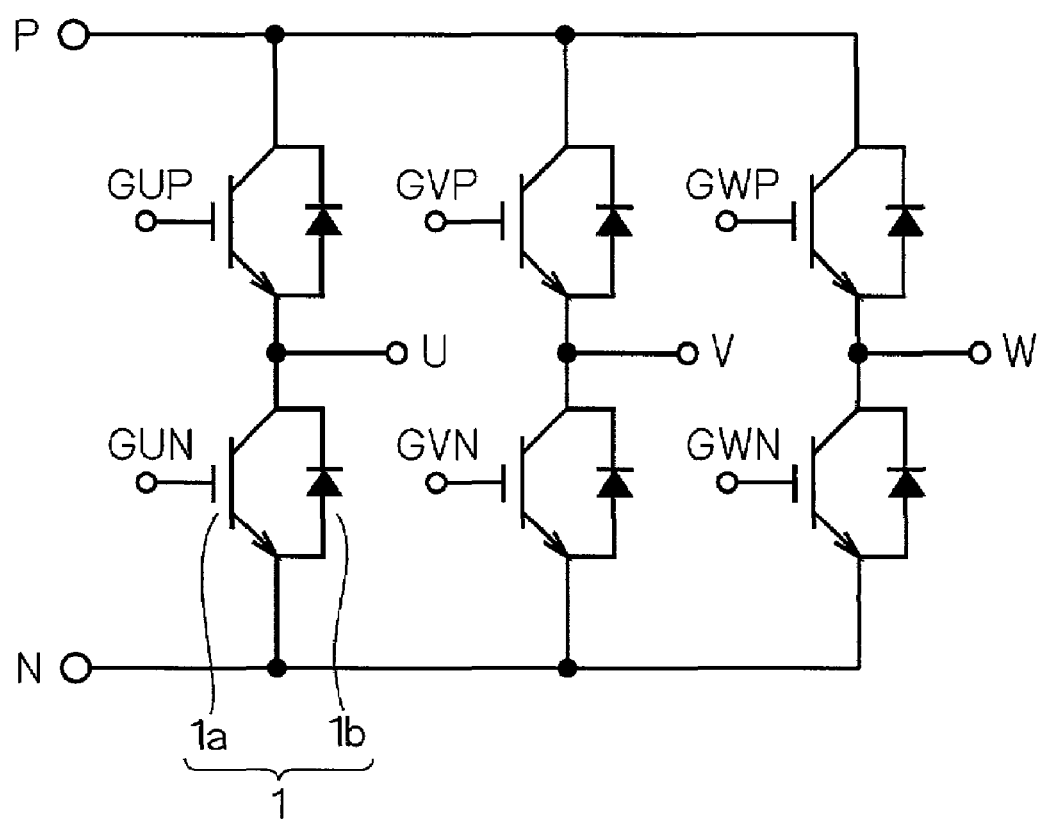

F I G . 5
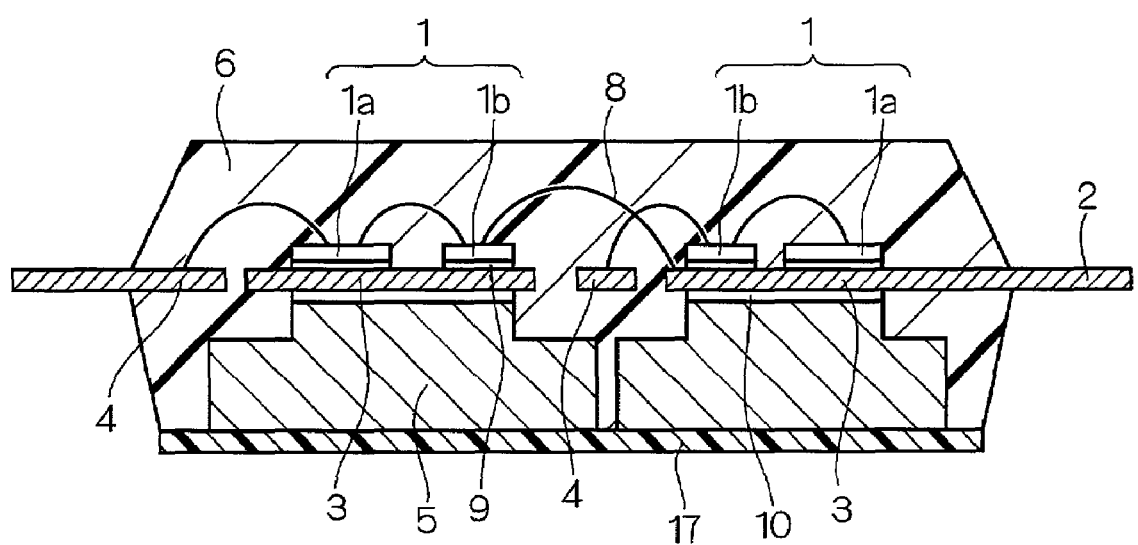

SEMICONDUCTOR DEVICE AND METHOD OF MANUFACTURING SAME

BACKGROUND OF THE INVENTION

1. Field of the Invention

The present invention relates to a structure of a semiconductor device and, more particularly, to a structure of a power semiconductor device for use in power control and a method of manufacturing the same.

2. Description of the Background Art

FIG. 8 is a schematic sectional view of a structure of a first background art power semiconductor device. As shown in FIG. 8, the first background art power semiconductor device comprises a power element 1, lead frames 2 formed from sheet metal, a metal block 5 functioning as a heat sink for heat dissipation, and a resin package 6.

The lead frames 2 have a die bonding pad portion 3 and an inner lead portion 4. The power element 1 is bonded to the die bonding pad portion 3 with solder 9. The power element 1 is formed with electrodes (not shown) connected to the inner lead portion 4 of one of the lead frames 2 through an aluminum wire 8. The metal block 5 has a protrusion provided substantially centrally thereof and spaced a predetermined distance apart from the opposite surface of the other lead frame 2 from the power element 1 in opposed relation to the power element 1. The resin package 6 seals the power element 1, the lead frames 2 and the metal block 5 while uncovering a surface of the metal block 5 opposite from the lead frames 2. An external heat dissipator 11 is mounted to an uncovered portion of the metal block 5. A portion of the resin package 6 which lies between the protrusion of the metal block 5 and the other lead frame 2 is referred to hereinafter as a resin insulation layer 27.

In some cases, an element for forming a control circuit for the power element 1 in addition to the power element 1 is formed on the die bonding pad portion 3.

FIG. 9 is a schematic sectional view of a structure of a second background art power semiconductor device. FIG. 10 is a sectional view, on an enlarged scale, of a portion B shown in FIG. 9. Such a structure is disclosed in, for example, Japanese Patent Application Laid-Open No. 10-93015 (1998). As shown in FIGS. 9 and 10, the second background art power semiconductor device comprises the power element 1, a diode 12, a heat diffusion plate 15, the lead frame 2, an insulation layer 37, a heat sink 25, and the resin package 6.

The power element 1 is bonded to the heat diffusion plate 15 made of copper with solder 9. A surface of the heat diffusion plate 15 opposite from the power element 1 is bonded to the die bonding pad portion 3 of the lead frame 2 made of copper with solder 9. A surface of the lead frame 2 opposite from the heat diffusion plate 15 is fixed to the heat sink 25 made of copper with the insulation layer 37. In the manufacturing steps, the lead frame 2 is previously fixed to the heat sink 25, and then the heat diffusion plate 15 with the power element 1 bonded thereto is bonded to the die bonding pad portion 3 of the lead frame 2. The diode 12, which generates less heat than the power element 1, is directly bonded to the lead frame 2 with the solder 9 without using the heat diffusion plate 15 therebetween. The power element 1 is formed with electrodes (not shown) connected to the inner lead portion 4 of the lead frame 2 through the aluminum wire 8. The resin package 6 seals the power element 1, the diode 12, the lead frame 2 and the heat diffusion plate 15 while uncovering a surface of the heat sink 25 opposite from the lead frame 2.

In the first background art power semiconductor device, heat generated from the power element 1 flows through the other lead frame 2, the resin insulation layer 27 and the metal block 5 and is then dissipated from the external heat dissipator 11 to the exterior. The metal block 5 and the external heat dissipator 11 are made of a material selected from the group consisting of aluminum and copper which are about 230 W/mK and about 390 W/mK in thermal conductivity, respectively. The lead frames 2 are also formed of a metal such as copper, and accordingly have a thermal conductivity similar to those of the metal block 5 and the external heat dissipator 11. The resin which forms the resin insulation layer 27 has a thermal conductivity of 1 to 3 W/mK. In this manner, the resin insulation layer 27 has the thermal conductivity which is about 1/100 those of other materials, and is therefore a main deterrent to heat conduction.

The heat dissipation characteristic of a semiconductor device is determined by the thickness and thermal conductivity of a material through which heat passes, an area over which heat passes through a material, and the like. In the first background art power semiconductor device, the reduction in the thickness of the resin insulation layer 27 may be made to reduce a portion of poor heat conduction through which heat passes, thereby improving the heat dissipation characteristic. However, the resin insulation layer 27 must have a dielectric breakdown voltage of thousands of volts, and therefore has a thickness limit of about 0.5 mm. This gives rise to a limit to the improvement in the heat dissipation characteristic.

Further, the use of ceramic powder having a high thermal conductivity, for example, powder of aluminum nitride, silicon nitride or the like as a filler to be added to the resin which forms the resin insulation layer 27 and the increase in filling factor of the ceramic powder allow the increase in the thermal conductivity of the resin insulation layer 27 up to about 5 W/mK. However, since the resin insulation layer 27 is a part of the resin package 6, this technique results in the use of the ceramic-powder-filled resin for other parts of the resin package 6 than the resin insulation layer 27, i.e., parts which need not have such a high thermal conductivity. This causes the needless use of the costly resin, to increase the cost of the materials of the semiconductor device.

The heat generated from the power element 1 passes through the other lead frame 2 and then through the resin insulation layer 27. Unlike the metal block 5, the lead frames 2, in general, are not permitted to increase the thickness thereof in terms of processing problems, and accordingly produce a lower heat diffusion effect than the metal block 5 and the like. It has therefore been difficult to sufficiently increase the area over which heat passes through the resin insulation layer 27, which has been one of the causes of the limitations of the improvement in the heat dissipation characteristic.

In the second background art power semiconductor device, the lead frame 2 and the heat diffusion plate 15 are disposed between the power element 1 and the insulation layer 37. The heat diffusion plate 15 diffuses the heat generated from the power element 1 in a horizontal direction perpendicular to the thickness direction thereof to increase the area over which heat passes through the insulation layer 37. However, the increase in the horizontal dimension of the heat diffusion plate 15 disposed between the power element 1 and the lead frame 2 for the purpose of improving the heat dissipation characteristic presents difficulties in wiring of the aluminum wire 8 which connects the power element 1 and the lead frame 2 to each other. There is also another problem such that the increase in the thickness of the heat diffusion plate 15 elongates the wiring length of the aluminum wire 8 to increase power dissipation.

To enhance the thermal conductivity, a ceramic-material-filled resin is sometimes used only for the insulation layer 37. In other words, different resins are sometimes used for the resin package 6 and the insulation layer 37. In such a case, when the resin package 6 is formed after the lead frame 2 and the heat sink 25 are bonded together, i.e., after the insulation layer 37 is cured, peeling is prone to occur at the interface between the resin package 6 and the insulation layer 37. This decreases the dielectric breakdown voltage between the lead frame 2 and the heat sink 25.

SUMMARY OF THE INVENTION

According to a first aspect of the present invention, a semiconductor device comprises: a semiconductor element; a lead frame having a first surface for mounting the semiconductor element thereon, and a second surface opposite from the first surface; a metal block provided on the second surface of the lead frame; an insulation layer provided on the metal block opposite the lead frame; and a bonding material between the second surface of the lead frame and the metal block, the bonding material being better in heat conduction than the insulation layer.

Preferably, in the semiconductor device of the first aspect, the metal block is disposed in opposed relation to the semiconductor element.

According to a second aspect of the present invention, in the semiconductor device of the first aspect, the metal block has a wider surface than the bonding material opposite the bonding material.

According to a third aspect of the present invention, in the semiconductor device of the first or second aspect, the semiconductor element includes a plurality of semiconductor elements; and the metal block is separate for each insulated unit between the semiconductor elements, and is provided in corresponding relation to at least one of the semiconductor elements.

According to a fourth aspect of the present invention, the semiconductor device of any one of the first to third aspects further comprises a resin package for sealing the semiconductor element, the lead frame and the metal block while uncovering the insulation layer, wherein the insulation layer is better in heat conduction than the resin package.

Preferably, in the semiconductor device of the fourth aspect, the insulation layer comprises a base material with the same base as the resin package, and ceramic powder.

According to a fifth aspect of the present invention, in the semiconductor device of any one of the first to fourth aspects, the metal block has a first surface and a second surface opposite the insulation layer; the first surface of the metal block is closer, as viewed in the vertical direction, to the lead frame than is the second surface of the metal block; and the bonding material lies between the second surface of the lead frame and the first surface of the metal block.

According to a sixth aspect of the present invention, in the semiconductor device of any one of the first to fourth aspects, the lead frame has a third surface; and the third surface is closer, as viewed in the vertical direction, to the semiconductor element than is the second surface to define an insulation space between the metal block and the third surface.

According to a seventh aspect of the present invention, a method of manufacturing a semiconductor device comprises the steps of: (a) preparing a semiconductor element; (b) preparing a first resin in a semi-cured state; (c) covering the semiconductor element and the first resin with a second resin, the step (c) being performed after the steps (a) and (b); and (d) simultaneously curing the first resin and the second resin, the step (d) being performed after the step (c).

According to an eighth aspect of the present invention, the method of the seventh aspect further comprises the steps of: (e) preparing a lead frame having a first surface and a second surface opposite from the first surface, and a metal block, the step (e) being performed before the step (c); (f) mounting the semiconductor element on the first surface of the lead frame, the step (f) being performed before the step (c) and after the steps (a), (b) and (e); (g) providing the metal block on the second surface of the lead frame, with a bonding material therebetween, the step (g) being performed before the step (c) and after the steps (a), (b) and (e); and (h) providing the first resin on the metal block opposite the lead frame, the step (h) being performed before the step (c) and after the steps (a), (b) and (e), wherein the bonding material is better in heat conduction than the first resin, and wherein the second resin in the step (c) also covers the lead frame and the metal block while uncovering the first resin.

Preferably, in the method of the eighth aspect, the first resin comprises a base material with the same base as the second resin, and ceramic powder.

In the semiconductor device of the first aspect of the present invention, good heat conduction in the bonding material positioned near the semiconductor element which is a heat source achieves good heat dissipation from the metal block.

Additionally, the insulation layer provided on the metal block may be made responsible for a dielectric breakdown voltage. Therefore, the bonding material may be selected from the viewpoint of heat conduction without the need for consideration of the dielectric breakdown voltage.

In the semiconductor device of the second aspect of the present invention, the metal block has a wider surface than the bonding material to diffuse the heat from the semiconductor element. Thus, the insulation layer which is a main deterrent to heat conduction can pass heat therethrough over a wider area. Consequently, a heat dissipation characteristic is improved.

In the semiconductor device of the third aspect of the present invention, the metal block is separate for each insulated unit of the semiconductor elements. Therefore, the single semiconductor device may comprise a plurality of semiconductor elements while maintaining electrical insulation between the semiconductor elements.

The semiconductor device of the fourth aspect of the present invention, which comprises the insulation layer better in heat conduction than the resin package, has a higher heat dissipation characteristic than a semiconductor device comprising the insulation layer made of the same material as the resin package.

In the semiconductor device of the fifth aspect or the sixth aspect of the present invention, the formation of the insulation space between the metal block and the lead frame enables the metal block to be sized to horizontally extend to near the outline of the semiconductor device. This enhances the heat dissipation characteristic.

In the method of manufacturing the semiconductor device of the seventh aspect of the present invention, the simultaneous curing of the insulation layer and the resin package reduces peeling at an interface between the different resins. Consequently, the dielectric breakdown voltage is increased.

In the method of manufacturing the semiconductor device of the eighth aspect of the present invention, the insulation layer and the resin package are produced as different components. This allows the use of resin of high thermal conductivity only for the insulation layer which influences the heat dissipation characteristic. This reduces the costs of materials.

It is therefore an object of the present invention to provide a semiconductor device having a satisfactory heat dissipation characteristic and a satisfactory dielectric breakdown voltage, and a method of manufacturing the same.

These and other objects, features, aspects and advantages of the present invention will become more apparent from the following detailed description of the present invention when taken in conjunction with the accompanying drawings.

BRIEF DESCRIPTION OF THE DRAWINGS

FIG. 3 is a circuit diagram of the semiconductor device according to a second preferred embodiment of the present invention;

FIG. 5 is a schematic sectional view of the structure of the semiconductor device according to the second preferred embodiment;

DESCRIPTION OF THE PREFERRED EMBODIMENTS

First Preferred Embodiment

Figure 1:
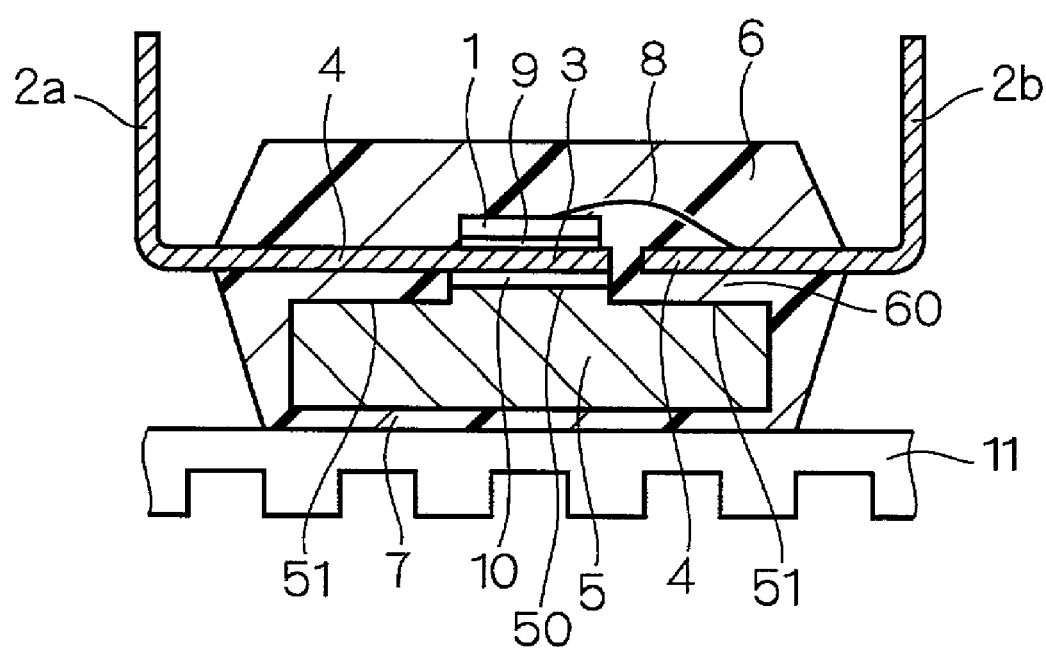
FIG. 1 is a schematic sectional view of a structure of a semiconductor device according to a first preferred embodiment of the present invention.

FIG. 1 is a schematic sectional view of a structure of a semiconductor device according to a first preferred embodiment of the present invention. As shown in FIG. 1, the semiconductor device according to the first preferred embodiment comprises a power semiconductor element (referred to hereinafter as a power element) 1, lead frames 2a and 2b, a metal block 5, and a resin package 6.

The lead frames 2a and 2b are formed from a sheet of metal having good thermal conductivity, e.g., a copper alloy. The lead frame 2a has a die bonding pad portion 3 and an inner lead portion 4, and the lead frame 2b has an inner lead portion 4. The power element 1 has first and second electrodes (not shown) on first and second surfaces thereof, respectively. The power element 1 is mounted on the die bonding pad portion 3 of the lead frame 2a and is bonded to the die bonding pad portion 3 with solder 9 so that the first electrode on the first surface thereof contacts the lead frame 2a. The second electrode on the second surface of the power element 1 is connected to the inner lead portion 4 of the lead frame 2b through an aluminum wire 8. The lead frames 2a and 2b are separate from each other, and the first and second electrodes formed on the first and second surfaces of the power element 1 are insulated from each other.

The metal block 5 is formed of a material selected from the group consisting of, for example, aluminum and copper, and is bonded to a surface of the lead frame 2a opposite from the power element 1 with a bonding material 10. More specifically, one main surface of the metal block 5 comprises a bonding surface 50 and non-bonding surface 51 which are disposed in opposed relation to the lead frame 2a. The bonding surface 50 is closer, as viewed in the vertical direction, to the power element 1 than is the non-bonding surface 51, and is bonded to the lead frame 2a with the bonding material 10 in opposed relation to the power element 1. In other words, the one main surface of the metal block 5 has a protrusion bonded to the lead frame 2a in opposed relation to the power element 1. The opposite surface of the metal block 5 from the lead frame 2a is wider than the bonding area between the lead frame 2a and the power element 1. An insulation space 60 is defined between the non-bonding surface 51 and the lead frame 2b.

The resin package 6 is made of, for example, an epoxy-based resin. The resin package 6 comprises an insulation layer 7 formed on the opposite surface of the metal block 5 from the lead frames 2a and 2b, and seals the power element 1, the lead frames 2a, 2b and the metal block 5. An external heat dissipator 11 is mounted to a surface of the insulation layer 7 opposite from the metal block 5.

In the semiconductor device according to the first preferred embodiment having the above-mentioned structure, heat generated from the power element 1 flows through the solder 9, the lead frame 2a, the bonding material 10, the metal block 5 and the insulation layer 7, and is then dissipated from the external heat dissipator 11 to the exterior. The bonding material 10 may be selected without consideration for dielectric breakdown voltage since it is not necessary for the bonding material 10 to ensure electrical insulation between the lead frame 2a and the metal block 5. More specifically, if an additional semiconductor device is mounted to the external heat dissipator 11, the insulation layer 7 maintains electrical insulation between the semiconductor devices. Thus, consideration need not be given to the dielectric breakdown voltage when selecting the bonding material 10. For this reason, the bonding material 10 may employ a material of better heat conduction, e.g. solder, than the insulation layer 7. Consequently, the heat generated from the power element 1 is satisfactorily transferred from the lead frame 2a to the metal block 5.

The thickness of the bonding material 10 may be made less than that of the resin insulation layer 27 of the first background art power semiconductor device even when a resin adhesive is used as the bonding material 10. More specifically, the bonding material 10 may have a thickness of 10 to 40 μm to achieve reduction in thickness to about 1/10 as compared with the thickness of the background art resin insulation layer 27. Further, an adhesive with, e.g., metal powder added thereto as a filler, i.e., an adhesive having a high thermal conductivity may be used as the bonding material 10. As a result, the thermal conductivity of the bonding material 10 made of the resin adhesive may be increased up to five to ten times (5 to 20 W/mK) that of the background art resin insulation layer 27. In this manner, even the use of the resin adhesive as the bonding material 10 enables the heat generated from the power element 1 to be satisfactorily transferred to the metal block 5.

Figure 2A:
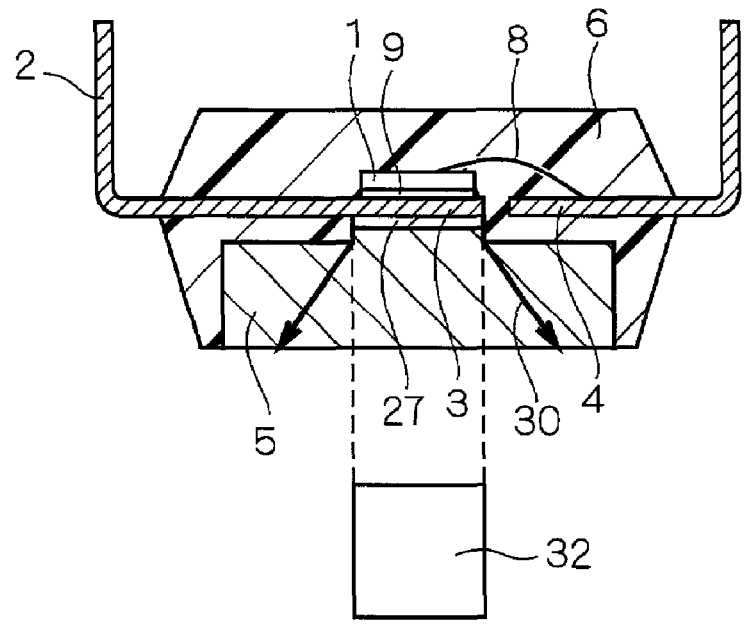
FIGS. 2A and 2B show conduction of heat generated from a power element.
Figure 2B:
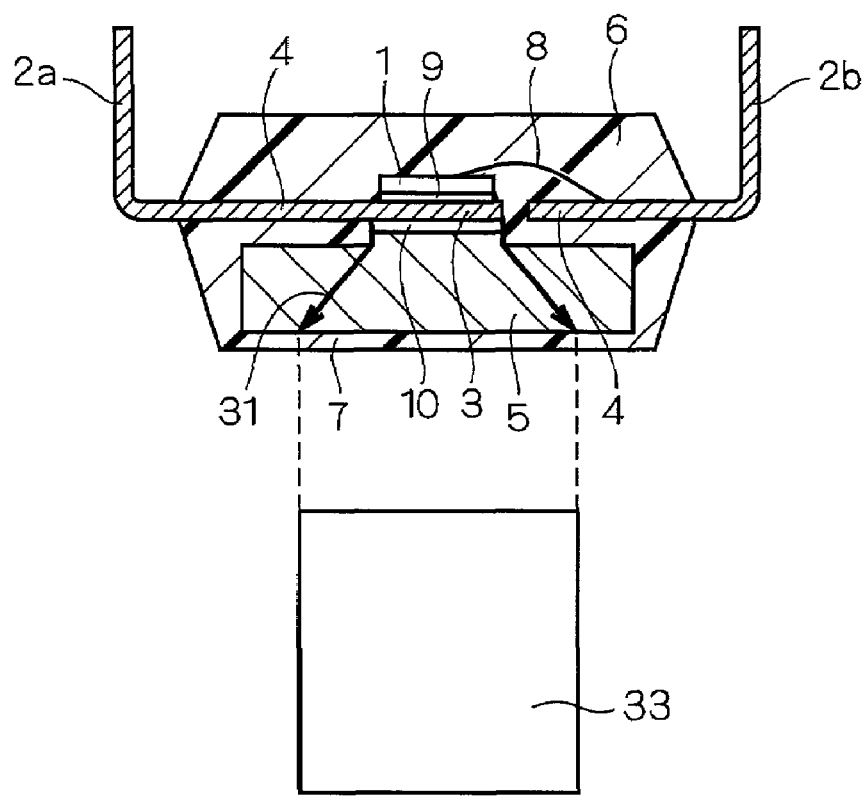

Next, the heat passing through the insulation layer 7 which is a main deterrent to heat conduction will be described in detail. FIGS. 2A and 2B show the conduction of heat generated from the power element 1. FIG. 2A shows the heat conduction in the above-mentioned first background art power semiconductor device, and FIG. 2B shows the heat conduction in the semiconductor device according to the first preferred embodiment. As indicated by a heat diffusion direction 30 shown in FIG. 2A, the heat generated from the power element 1 is diffused slightly in the horizontal direction by the lead frame 2, but is not sufficiently diffused because of the small thickness of the lead frame 2 in the first background art power semiconductor device. Therefore, an area 32 over which heat passes through the resin insulation layer 27 which is the main deterrent to heat conduction in the first background art power semiconductor device is approximately equal to the area of the power element 1. On the other hand, as indicated by a heat diffusion direction 31 shown in FIG. 2B, the heat generated from the power element 1 is diffused slightly in the horizontal direction by the lead frame 2a, and is also diffused by the metal block 5 having a sufficient thickness in the first preferred embodiment. Therefore, an area 33 over which heat passes through the insulation layer 7 is sufficiently greater than the area of the power element 1. In other words, the deterrent to heat conduction in the first preferred embodiment is less than that in the first background art power semiconductor device.

As described above, the semiconductor device according to the first preferred embodiment improves the heat dissipation characteristic.

Additionally, the formation of the insulation space 60 between the metal block 5 and the lead frame 2b enables the metal block 5 to be sized to horizontally extend to near the outline of the semiconductor device while electrical insulation is maintained between the first and second electrodes on the respective surfaces of the power element 1. This enhances the heat dissipation characteristic.

Although the size of the metal block 5 influences the wiring of the aluminum wire 8 in the second background art power semiconductor device, the size of the metal block 5 in the first preferred embodiment may be determined without influences upon the wiring of the aluminum wire 8 since the metal block 5 is bonded to the opposite surface of the lead frame 2a from the power element 1.

The first preferred embodiment proposes a novel semiconductor device structure which has not been found in the background art. In the first preferred embodiment, however, the conventional manufacturing method and apparatus may be used before and in the step of producing the aluminum wire 8 by performing the step of bonding the lead frame 2a and the metal block 5 together immediately before the step of forming the resin package 6. Therefore, the first preferred embodiment can minimize new plant and equipment investments.

Second Preferred Embodiment

FIG. 3 is a circuit diagram of the semiconductor device according to a second preferred embodiment of the present invention. As shown in FIG. 3, the semiconductor device according to the second preferred embodiment comprises, for example, a three-phase inverter circuit. More specifically, the semiconductor device according to the second preferred embodiment comprises three pairs of power elements 1 each including an IGBT 1a and a diode 1b connected in anti-parallel with the IGBT 1a, the power elements 1 of each pair being connected in series which are referred to as an arm. Thus, three arms are connected in parallel.

Output terminals U, V and W are connected to, e.g., an AC motor. Input terminals P and N are directly connected to, e.g., a DC power supply or an output of a power rectifier circuit which generates a DC voltage from a commercial power supply. Control terminals GUP, GUN, GVP, GVN, GWP and GWN are controlled to turn on/off the respective IGBTs 1a, thereby controlling the rotation of the AC motor.

Figure 4:
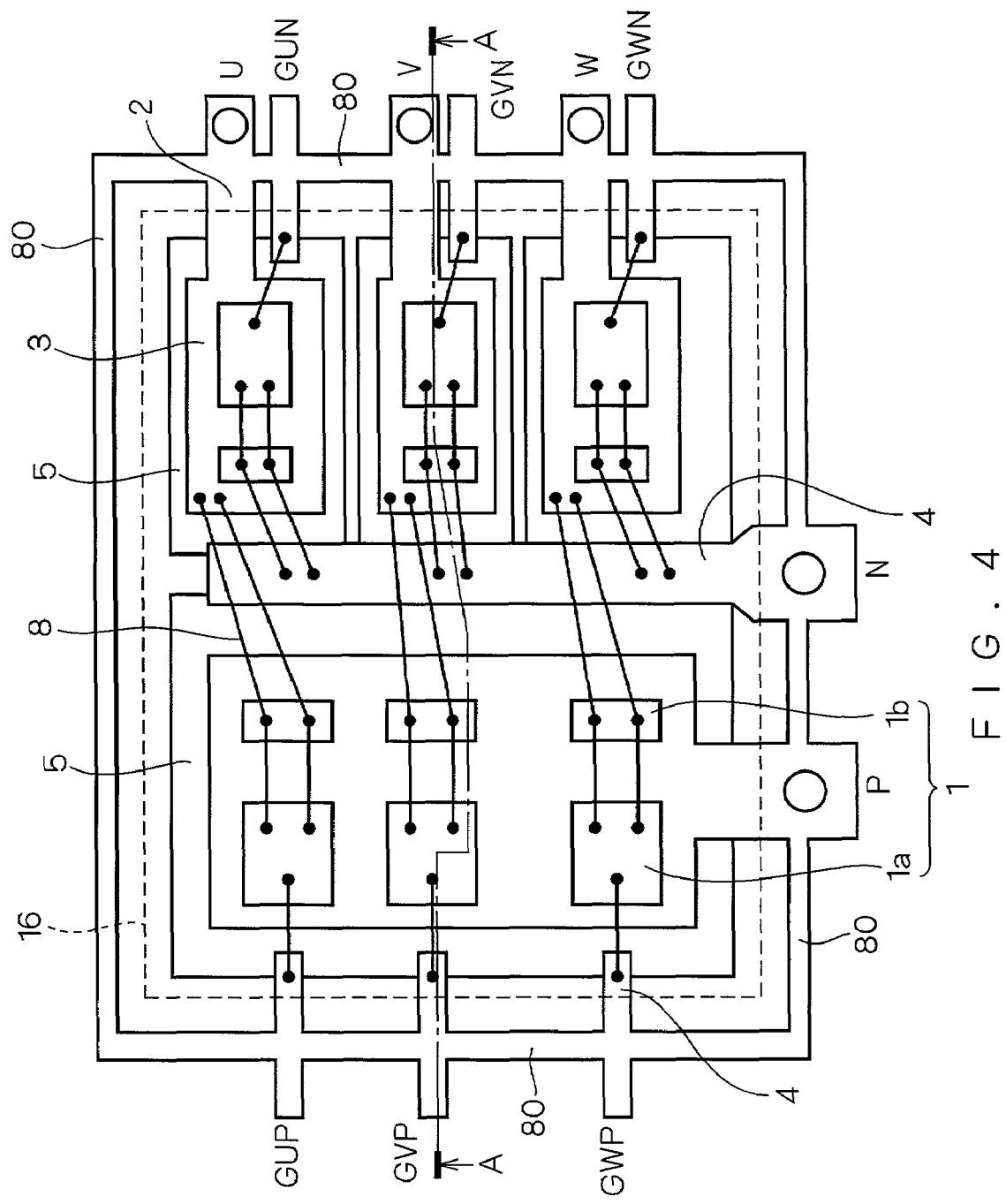
FIG. 4 is a schematic plan view of a structure of the semiconductor device according to the second preferred embodiment.

FIG. 4 is a schematic plan view of a structure of the semiconductor device shown in circuit diagram of FIG. 3 according to the second preferred embodiment. FIG. 5 is a sectional view taken along the line A—A of FIG. 4, and shows a section after the resin package is formed.

With reference to FIGS. 4 and 5, the semiconductor device according to the second preferred embodiment comprises the power elements 1, the lead frames 2, the metal blocks 5, an insulation layer 17, and the resin package 6. In FIG. 4, the resin package 6 is not illustrated but a region 16 in which the resin package 6 is to be formed is illustrated for the purpose of facilitating the understanding of the structure.

The semiconductor device according to the second preferred embodiment comprises the plurality of power elements 1 each corresponding to the power element 1 of the semiconductor device according to the first preferred embodiment, and the insulation layer 17 is made of a resin different from that of the resin package 6. The lead frame 2 and the metal block 5 are provided for each insulated unit between the power elements 1. The power element 1 is mounted on the die bonding pad portion 3 of each of the lead frames 2. The power elements 1 are formed with electrodes (not shown) connected to the inner lead portions 4 of the lead frames 2 through the aluminum wires 8. The lead frames 2 are connected to each other through a tie bar 80. The tie bar 80 is cut off after the formation of the resin package 6, whereby the lead frames 2 are separated from each other.

The metal block 5 is provided for each of the lead frames 2, and has a main surface provided with a protrusion bonded to a corresponding one of the lead frames 2 in opposed relation to a corresponding one of the power elements 1.

The insulation layer 17 is formed on the opposite surface of the metal blocks 5 from the lead frames 2, and extends across the plurality of metal blocks 5. In other words, the plurality of metal blocks 5 are mounted on the single insulation layer 17. The insulation layer 17 is made of a material of high thermal conductivity, for example, a resin with, e.g., ceramic powder added thereto as a filler. Examples of the ceramic powder include silica, specifically crystalline silica, alumina, aluminum nitride, silicon nitride, and boron nitride. The resin package 6 seals the power elements 1, the lead frames 2 and the metal blocks 5 while uncovering the insulation layer 17. In some cases, an external heat dissipator is mounted to an uncovered portion of the insulation layer 17 opposite from the metal blocks 5, but is not illustrated in FIG. 5. With reference to FIG. 4, the metal block 5 corresponding to the P-side power elements 1 may be separated into a plurality of metal blocks similar to the N-side metal blocks 5 each corresponding to the single power element 1. That is, the metal block 5 is provided for each insulated unit between the power elements 1, and a plurality of metal blocks 5 corresponding to at least one power element 1 may be provided in each insulated unit.

Figure 6:
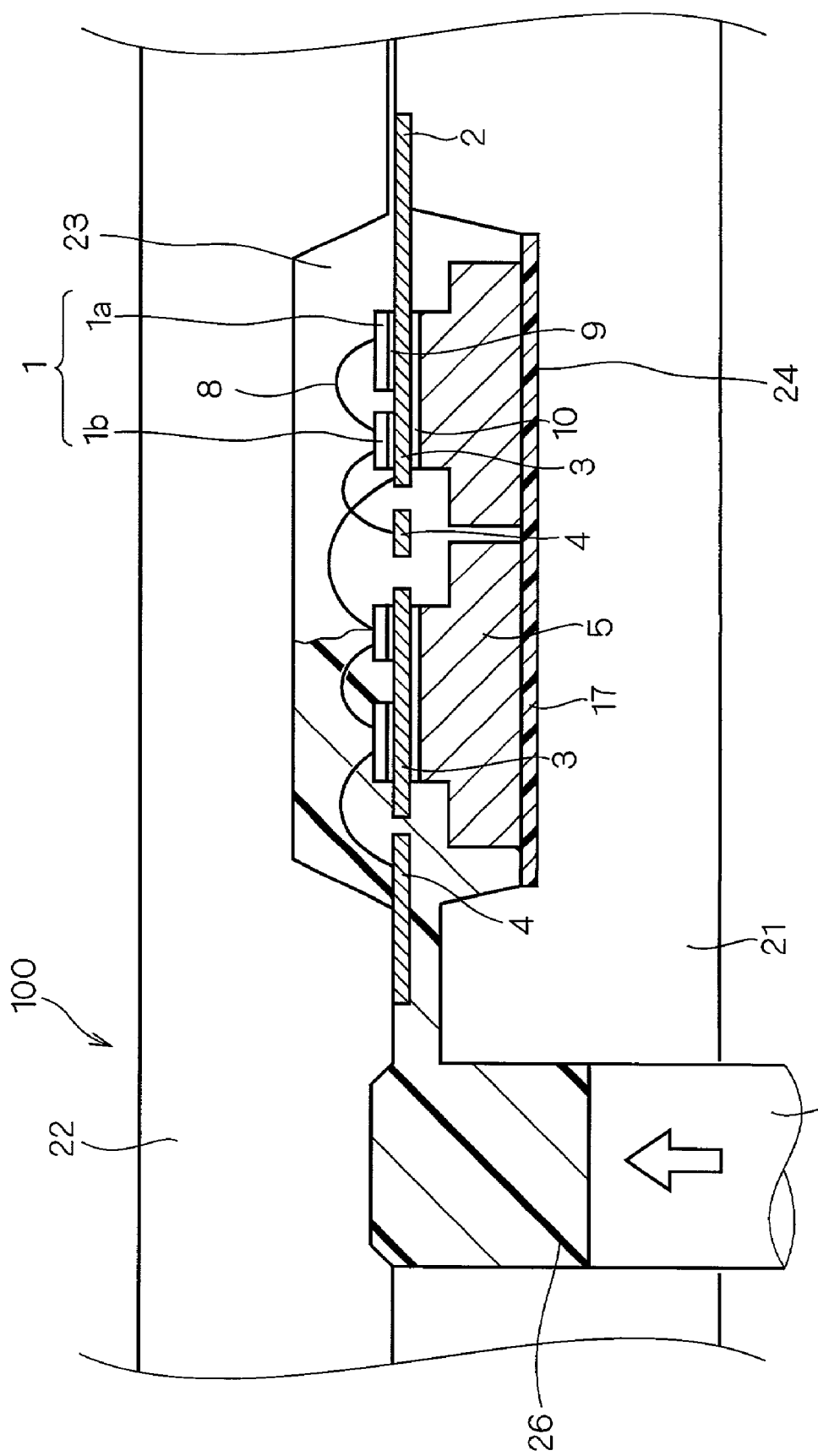
FIG. 6 shows a method of forming a resin package according to the second preferred embodiment.

A method of forming the resin package 6 will be described. FIG. 6 shows the method of forming the resin package 6 in the semiconductor device according to the second preferred embodiment. The resin package 6 is formed, for example, by transfer molding. A transfer molding apparatus 100 comprises a plunger 20 and molds 21, 22. The lead frames 2 to which the power elements 1 and the metal blocks 5 are bonded are prepared in a cavity 23 defined by the molds 21 and 22. The insulation layer 17 is placed between a cavity bottom surface 24 and the metal blocks 5. When the resin package 6 is made of, e.g., an epoxy-based resin, the material of the insulation layer 17 prepared herein is a resin semi-cured after the kneading step, or a so-called "B-stage" resin, which is obtained by adding ceramic powder as a filler to the same epoxy-based resin base material (the base material including a main material and a curing agent). Then, the plunger 20 applies pressure to a tablet of sealing resin 26 to fill the cavity 23 with the molten sealing resin 26. Thereafter, the semi-cured insulation layer 17 and the sealing resin 26 are simultaneously cured and molded to form the resin package 6.

Thus, the semiconductor device according to the second preferred embodiment is constructed so that the metal block 5 is provided for each separated lead frame 2, thereby maintaining electrical insulation between the power elements 1.

Further, the insulation layer 17 is provided as a different component from the resin package 6, rather than as a part of the resin package 6. This allows the use of the resin of high thermal conductivity only for the insulation layer 17 which influences the heat dissipation characteristic. Consequently the costs of materials are reduced.

The simultaneous curing and molding of the insulation layer 17 and the resin package 6 reduce peeling at an interface between the different resins. As a result, the dielectric breakdown voltage is increased.

In the semiconductor device according to the first preferred embodiment, voids are prone to develop in the insulation layer 7 having a small thickness when a material of low fluidity is used for the resin package 6. On the other hand, the second preferred embodiment in which the resin package 6 is formed after the insulation layer 17 is placed on the surface of the metal blocks 5 can reduce the occurrence of voids in the insulation layer 17. As a result, the dielectric breakdown voltage is increased. Additionally, the stabilized thickness of the insulation layer 17 suppresses variations in heat dissipation characteristic.

A semiconductor device manufactured by forming and curing the insulation layer 17 on the surface of the metal blocks 5 and then forming the resin package 6, and a semiconductor device manufactured by forming the resin package 6, with the surface of the metal blocks 5 uncovered, and then forming the insulation layer 17 are lower in dielectric breakdown voltage but can produce the remaining effects described above.

Third Preferred Embodiment

Figure 7:
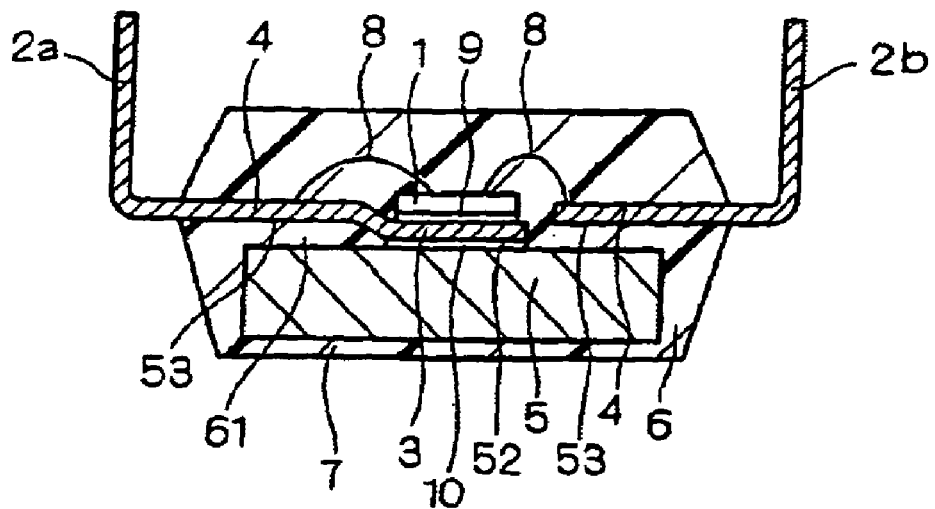
FIG. 7 is a schematic sectional view of a structure of the semiconductor device according to a third preferred embodiment of the present invention.
Figure 8:
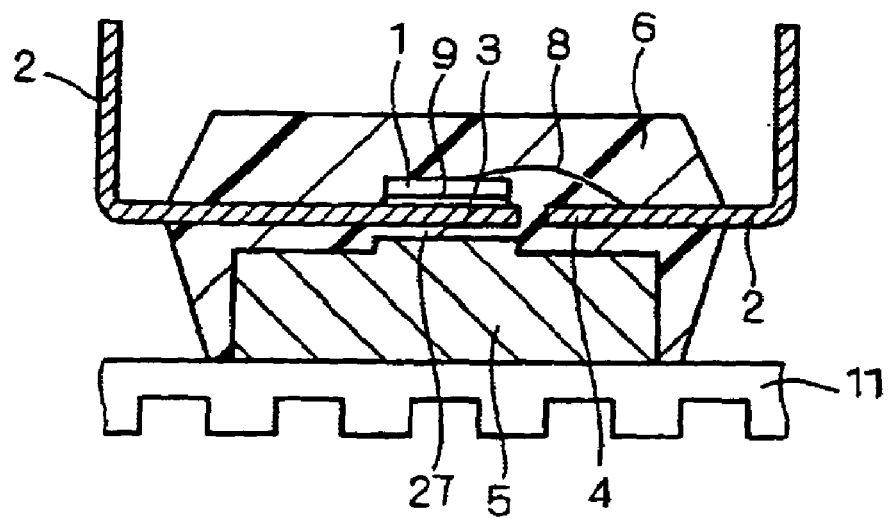
FIG. 8 is a schematic sectional view of a structure of a first background art power semiconductor device.
Figure 9:
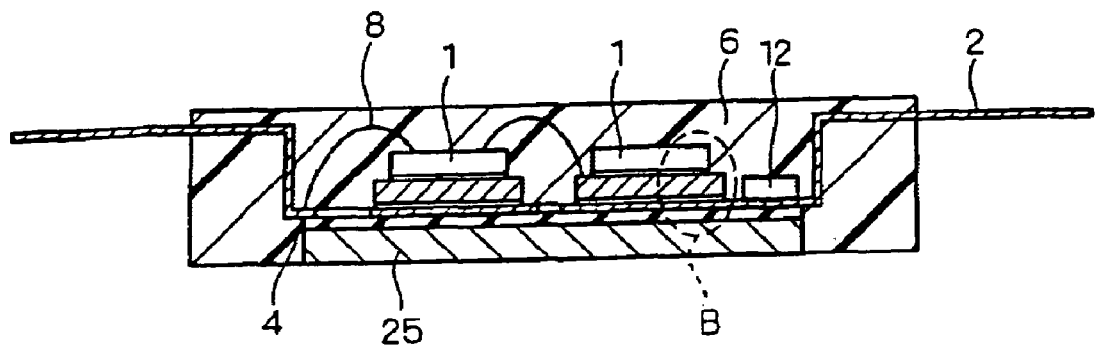
FIG. 9 is a schematic sectional view of a structure of a second background art power semiconductor device.
Figure 10:
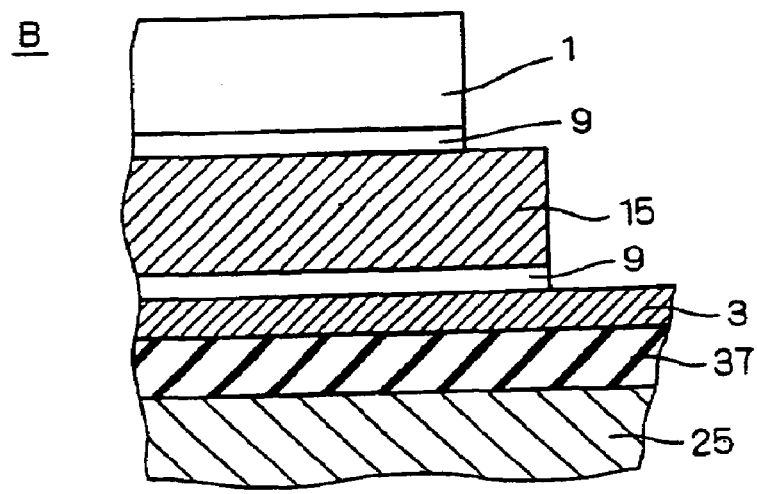
FIG. 10 is a sectional view, on an enlarged scale, of a portion of the structure of the second background art power semiconductor device.

FIG. 7 is a schematic sectional view of a structure of the semiconductor device according to a third preferred embodiment of the present invention. The semiconductor device according to the third preferred embodiment is such that a modification is made basically to the shapes of the lead frames 2a, 2b and the metal block 5 in the semiconductor device according to the first preferred embodiment.

The power element 1 has a plurality of electrodes (not shown), and the lead frames 2a and 2b are separated from each other for electrical insulation between the electrodes. The power element 1 is mounted on the die bonding pad portion 3 of the lead frame 2a. A first electrode of the power element 1 is connected through the aluminum wire 8 to the inner lead portion 4 of the lead frame 2a, and a second electrode of the power element 1 is connected through the aluminum wire 8 to the inner lead portion 4 of the lead frame 2b on which the power element 1 is not mounted. As a result, these electrodes of the power element 1 are insulated from each other.

The opposite surface of the die bonding pad portion 3 of the lead frame 2a from the power element 1 includes a bonding surface 52 to the metal block 5. The opposite surface of the inner lead portion 4 of the lead frame 2a from the connection to the aluminum wire 8 includes a non-bonding surface 53 which is closer, as viewed in the vertical direction, to the power element 1 than is the bonding surface 52, with an insulation space 61 defined between the metal block 5 and the non-bonding surface 53. In other words, the lead frame 2a is shaped such that the die bonding pad portion 3 thereof is sunk toward the metal block 5, and the sunk portion of the lead frame 2a and the metal block 5 are bonded to each other with the bonding material 10. The remaining structure of the semiconductor device according to the third present invention is similar to that of the semiconductor device according to the first preferred embodiment, and are not particularly described herein.

Thus, in the semiconductor device according to the third preferred embodiment, the formation of the insulation space 61 between the metal block 5 and the lead frames 2a and 2b except in the die bonding pad portion 3 enables the metal block 5 to be sized to horizontally extend to near the outline of the semiconductor device. This enhances the heat dissipation characteristic.

In the semiconductor device according to the first and second preferred embodiments, the metal block 5 having the protrusion necessitates the step of checking to see which surface of the metal block 5 is top or bottom and in which orientation to place the metal block 5, when bonding the metal block 5 to the lead frames 2, 2a, 2b. On the other hand, the third preferred embodiment features the shape of the lead frames 2a and 2b uniquely designed to maintain the insulation space 61, thereby allowing the use of the metal block 5 having a shape of a rectangular parallelepiped. This eliminates the need for the step of properly orienting the metal block 5 and the lead frame 2 for bonding, thereby enhancing the productivity of the semiconductor devices.

While the invention has been described in detail, the foregoing description is in all aspects illustrative and not restrictive. It is understood that numerous other modifications and variations can be devised without departing from the scope of the invention.

What is claimed is:

1. A semiconductor device comprising:
   a semiconductor element;
   a lead frame having a first surface on which said semiconductor element is mounted, and a second surface opposite to said first surface;
   a metal block on said second surface of said lead frame;
   an insulation layer on said metal block opposite said lead frame;
   a bonding material between said second surface of said lead frame and said metal block; and
   a resin package configured to seal said semiconductor element, said lead frame and said metal block while uncovering said insulation layer,
   wherein said bonding material has a higher heat conduction than said insulation layer, and
   wherein said insulation layer has a higher heat conduction than said resin package.

2. The semiconductor device according to claim 1, wherein said metal block is disposed in opposed relation to said semiconductor element.

3. The semiconductor device according to claim 1, wherein said metal block has a wider surface opposite said bonding material than said bonding material.

4. The semiconductor device according to claim 1, wherein said insulation layer comprises a base material with a same base as said resin package, and ceramic powder.

5. The semiconductor device according to claim 1, wherein said metal block has a first surface and a second surface opposite said insulation layer,
wherein said first surface of said metal block is closer, as viewed in a vertical direction, to said lead frame than is said second surface of said metal block, and
wherein said bonding material lies between said second surface of said lead frame and said first surface of said metal block.

6. A semiconductor device comprising:
a semiconductor element;
a lead frame having a first surface on which said semiconductor element is mounted, and a second surface opposite to said first surface;
a metal block on said second surface of said lead frame;
an insulation layer on said metal block opposite said lead frame; and
a bonding material between said second surface of said lead frame and said metal block,
wherein said bonding material has a higher heat conduction than said insulation layer,
wherein said semiconductor element includes a plurality of semiconductor elements, and
wherein said metal block is separate for each insulated unit between said semiconductor elements, and is provided in corresponding relation to at least one of said semiconductor elements.

7. A semiconductor device comprising:
a semiconductor element;
a lead frame having a first surface on which said semiconductor element is mounted, and a second surface opposite to said first surface;
a metal block on said second surface of said lead frame;
an insulation layer on said metal block opposite said lead frame; and
a bonding material between said second surface of said lead frame and said metal block,
wherein said bonding material has a higher heat conduction than said insulation layer,
wherein said lead frame has a third surface on the same side as said second surface,
wherein said third surface is closer, as viewed in a vertical direction, to said semiconductor element than is said second surface, and
wherein an insulation space is defined between said metal block and said third surface.

* * * * *